(12) United States Patent
Schwarz et al.

(10) Patent No.: US 11,952,263 B2
(45) Date of Patent: Apr. 9, 2024

(54) MICROMECHANICAL SENSOR DEVICE AND CORRESPONDING MANUFACTURING METHOD

(71) Applicant: Robert Bosch GmbH, Stuttgart (DE)

(72) Inventors: Mike Schwarz, Frankenberg (DE); Pascal Gieschke, Reutlingen (DE); Valentina Kramer-Sinzinger, Eningen Unter Achalm (DE)

(73) Assignee: ROBERT BOSCH GMBH, Stuttgart (DE)

( * ) Notice: Subject to any disclaimer, the term of this patent is extended or adjusted under 35 U.S.C. 154(b) by 206 days.

(21) Appl. No.: 17/419,511

(22) PCT Filed: Feb. 5, 2020

(86) PCT No.: PCT/EP2020/052848
§ 371 (c)(1),
(2) Date: Jun. 29, 2021

(87) PCT Pub. No.: WO2020/164988
PCT Pub. Date: Aug. 20, 2020

(65) Prior Publication Data
US 2022/0081281 A1    Mar. 17, 2022

(30) Foreign Application Priority Data
Feb. 12, 2019 (DE) .................... 10 2019 201 768.1

(51) Int. Cl.
*B81B 3/00* (2006.01)
(52) U.S. Cl.
CPC .... *B81B 3/0018* (2013.01); *B81B 2201/0264* (2013.01); *B81B 2203/0127* (2013.01); *B81B 2203/0315* (2013.01); *B81B 2203/033* (2013.01)

(58) Field of Classification Search
CPC .......... B81B 3/0018; B81B 2201/0264; B81B 2203/0127; B81B 7/0048;
(Continued)

(56) References Cited

U.S. PATENT DOCUMENTS 6,010,966 A * 1/2000 Ionov ................ H01L 21/32136
438/719
8,610,336 B1 * 12/2013 Wang ................... H03H 3/0073
310/343
(Continued)

FOREIGN PATENT DOCUMENTS

DE    102016203232 A1    10/2016
DE    102017220349    *  6/2018
(Continued)

OTHER PUBLICATIONS

Machine translation of Senz et al. (DE-102017220349) (Year: 2018).*
(Continued)

*Primary Examiner* — Yasser A Abdelaziez
(74) *Attorney, Agent, or Firm* — NORTON ROSE FULBRIGHT US LLP; Gerard A. Messina

(57) ABSTRACT

A micromechanical sensor device and manufacturing method. The micromechanical sensor device is provided with a cap substrate, which has a first front side and a first back side, and which has a through-opening as a media entry region; and with a sensor substrate, which has a second front side and a second back side, and which has, on the second front side, a sensor region that is embedded in an island-like region suspended on the remaining sensor substrate. The island-like region is mechanically decoupled from the remaining sensor substrate by a lateral stress-relief trench and by a cavity situated in the sensor substrate, underneath the island-like region. The first back side is bonded to the second front side so that the through opening is situated
(Continued)

above the sensor region. The sensor region is covered by a gel, which fills the through-opening and the stress-relief trench at least partially.

11 Claims, 13 Drawing Sheets

(58) Field of Classification Search
CPC ...... B81B 2203/0315; B81B 2203/033; B81C 1/00309
See application file for complete search history.

(56) References Cited

U.S. PATENT DOCUMENTS

2016/0272482 A1* 9/2016 Dawson ................ B81B 7/0048
2020/0326256 A1* 10/2020 Senz ................... G01L 19/0038

FOREIGN PATENT DOCUMENTS

| DE | 102017220349 B3 | | 6/2018 |
| DE | 102017202605 A1 | | 8/2018 |
| DE | WO2019/096560 | * | 5/2019 |

OTHER PUBLICATIONS

International Search Report for PCT/EP2020/052848, dated May 13, 2020.

* cited by examiner

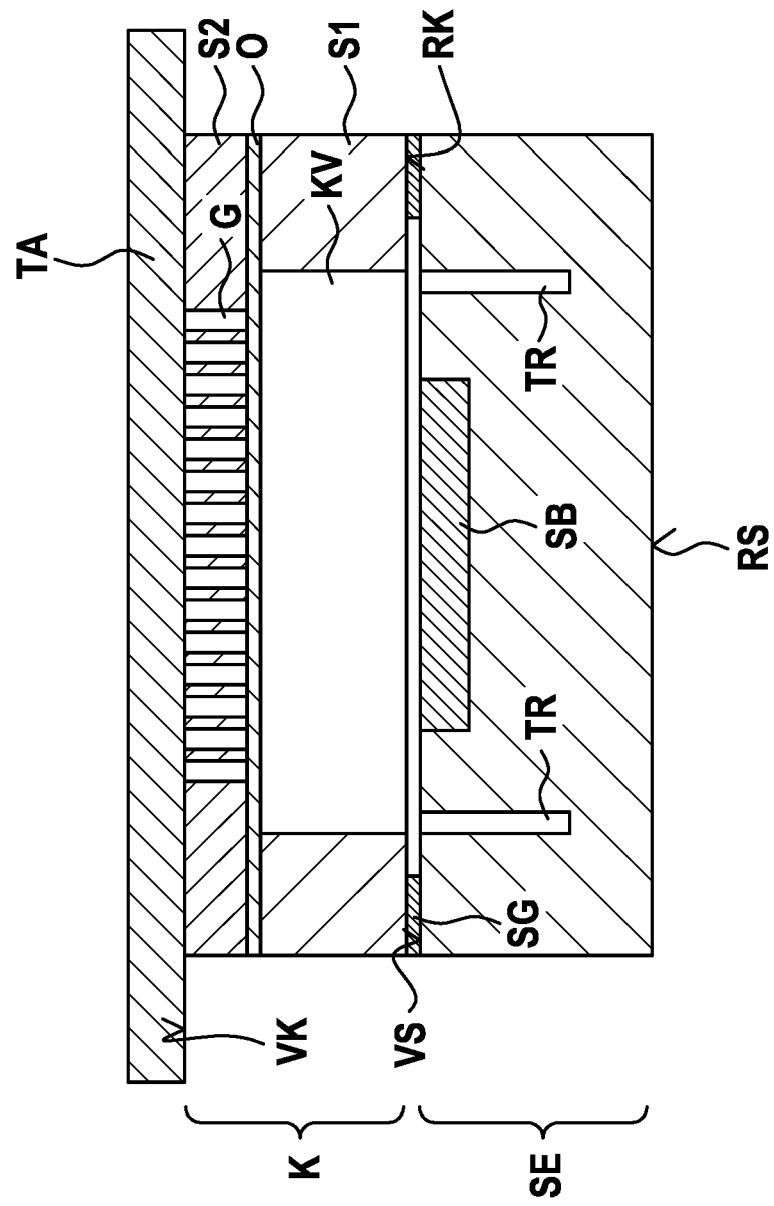

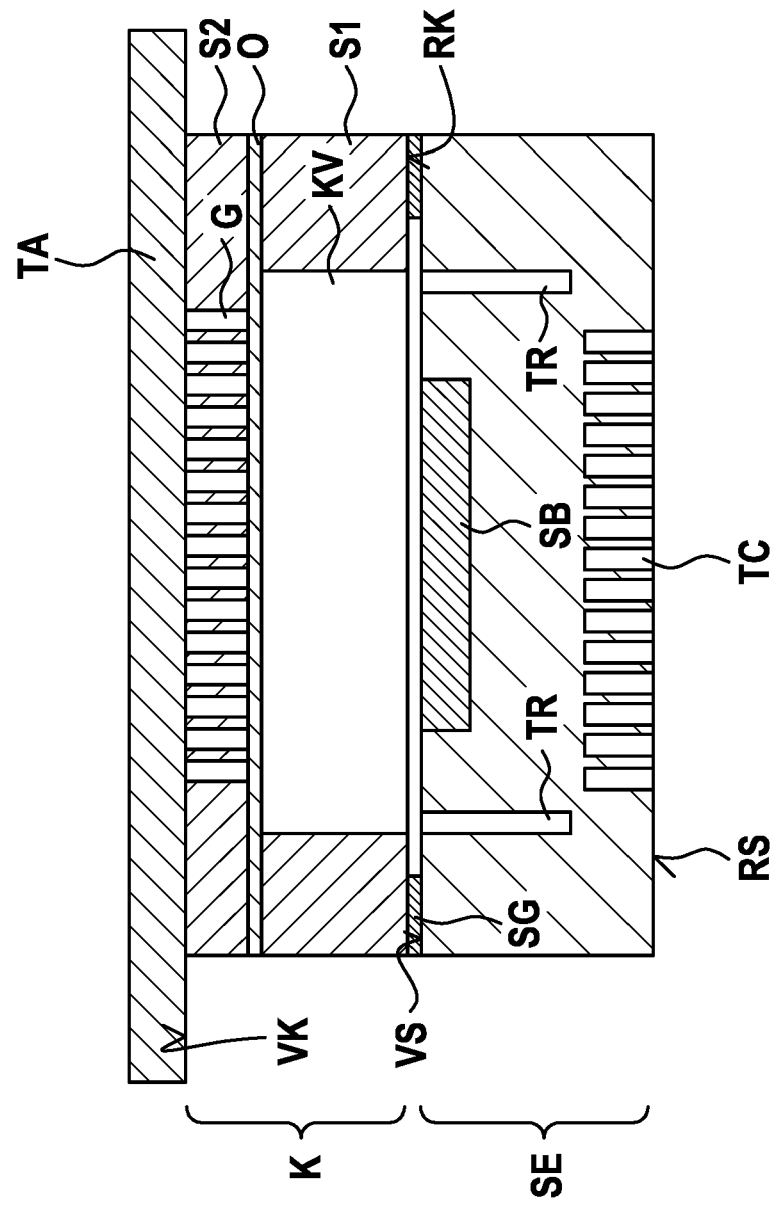

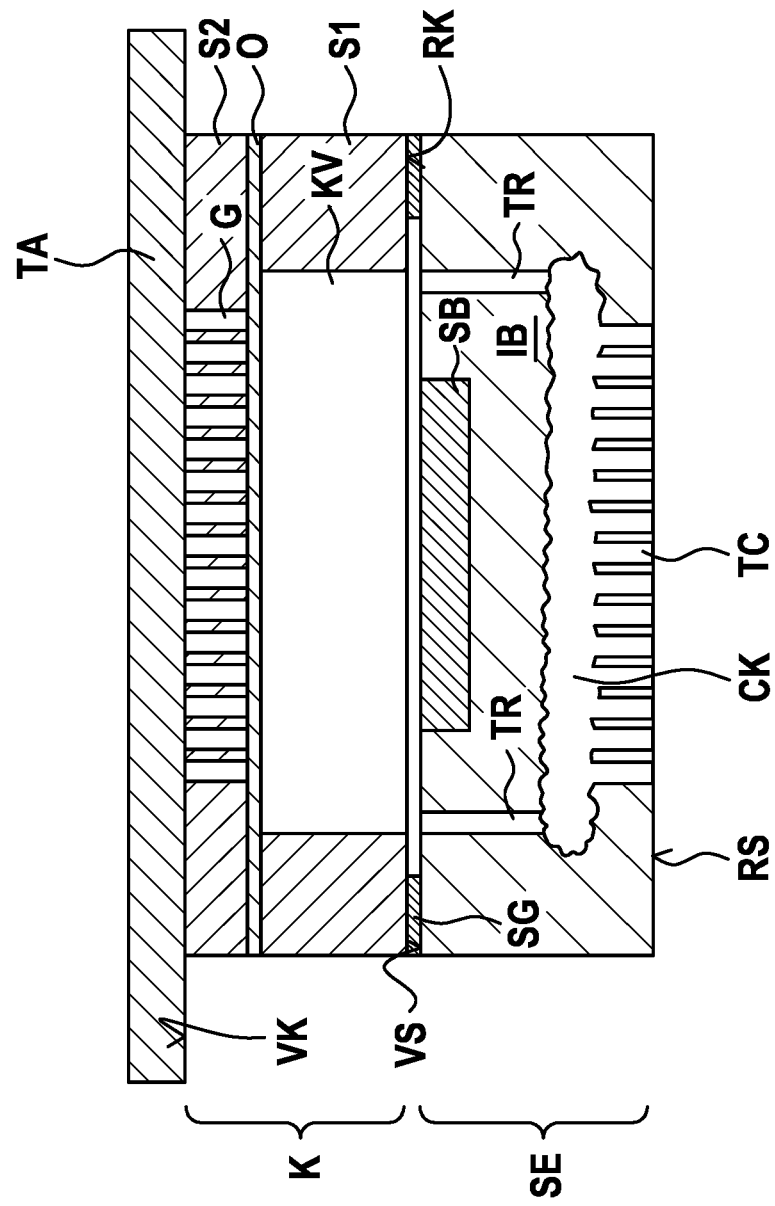

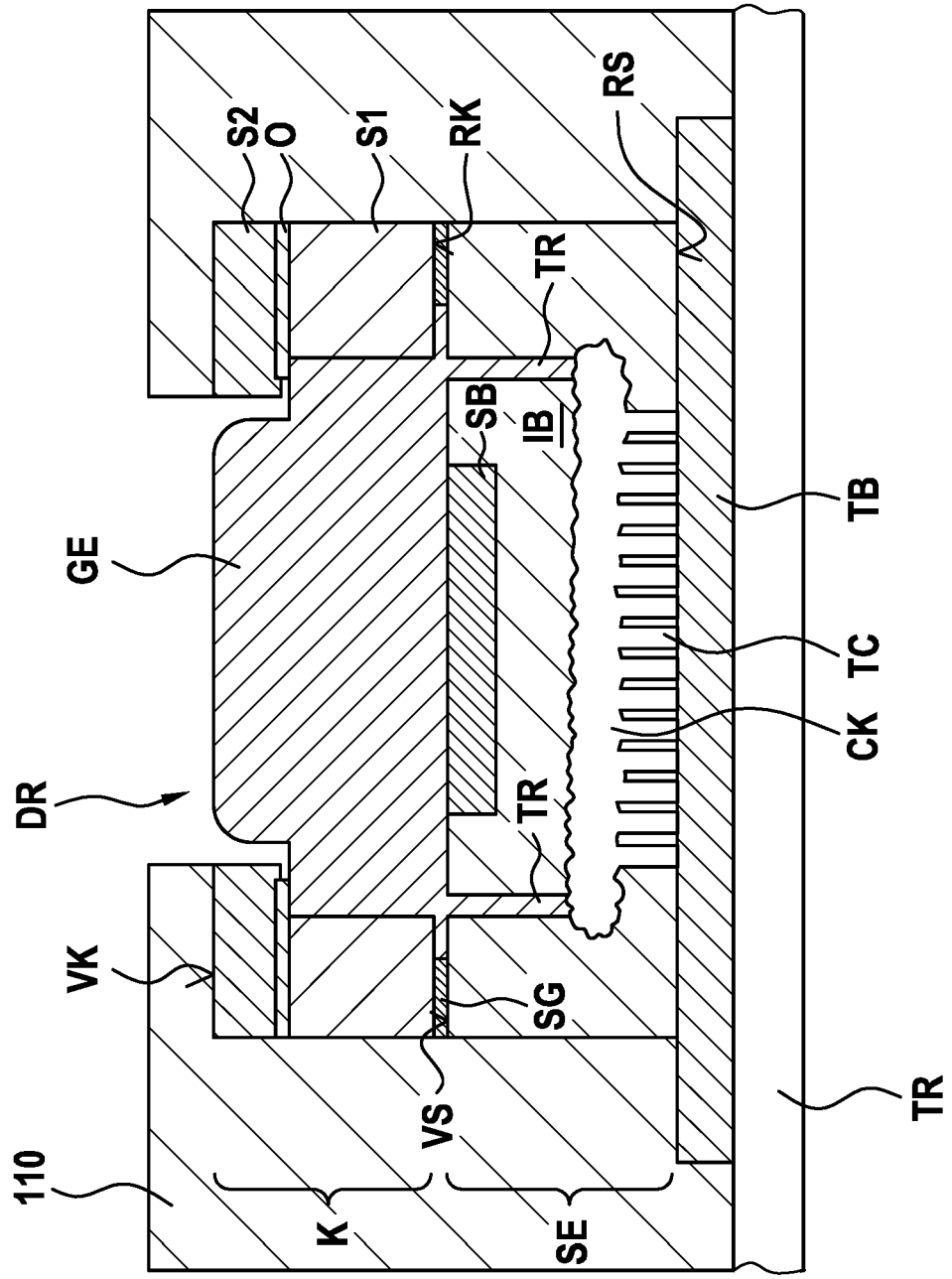

MICROMECHANICAL SENSOR DEVICE AND CORRESPONDING MANUFACTURING METHOD

FIELD

The present invention relates to a micromechanical sensor device and a corresponding manufacturing method.

BACKGROUND INFORMATION

Although any micromechanical components may also be used, the present invention and the problem forming the basis of it are described with reference to micromechanical pressure sensor devices.

In micromechanical pressure sensor devices, piezoresistive semiconductor resistors attached to a diaphragm are used as mechanical-to-electrical transducers. These semiconductor resistors not only absorb mechanical stresses, which are produced by the effect of pressure on the diaphragm, but also mechanical stresses, which are caused by interfering mechanical effects. Such interfering effects include deformation of the substrate, on which the pressure sensor device is mounted, deformation of the package due to the temperature during the manufacturing operation, e.g., during the soldering operation, as well as deformation of the package or the packaging elements in response to temperature changes in operation, which are particularly large in the case of a molded package.

Further interfering effects result from voltages on the pressure sensor element itself, namely, due to the thermal behavior of the covering layers and the thermal behavior of the metallic layer, in particular, in the case of large-area bonding pads. Such interfering effects may be controlled, to a certain extent, using suitable electrical balancing, e.g., in the dielectric covering layers. The effect of the metallic layer and the voltage coupled in on the part of the packaging is a considerable function of the history of the component, for example, due to creep of the metal, in particular, during and after the soldering operation. This is not able to be compensated for by electrical balancing prior to delivery of the components.

Therefore, additional mechanical decoupling of the sensor core, e.g., the diaphragm, including piezoresistors and, optionally, an additional temperature sensor/a temperature diode/a temperature transducer in a pressure sensor device, is desired. Current approaches to this include lateral release of the diaphragm by trenching, or release of the diaphragm by etching on all sides; as a rule, several connections to the edge of the chip remaining, in order to implement electrical connections, as described, for example, in German Patent Application No. DE 10 2017 202 605 A1.

For applications in the automotive branch and, increasingly, in the consumer goods branch, as well, resistance to media is of great significance, for pressure sensor devices are often installed in an environment having aggressive media, such as exhaust gases, motor oil, coolants, etc. These days, applying gel to the front side for resistance to media is conventional, but this does not include the decoupling of stress.

Molded packages, which are quite highly robust with regard to media, are normally used for inertial sensors, but not for pressure sensors. The reason for this is that a pressure sensor device requires access to the environment, an opening, the so-called pressure entry; and that in the case of deformation due to temperature change, molded packages exert considerable mechanical stress on the pressure sensor device. For a standard pressure sensor device having, for example, a cavity produced using porous silicon, this would mean a considerable reduction in the performance and would negatively affect, above all, the accuracy of the pressure measurement.

Molded packages are robust with respect to media, inexpensive, and small, but experience large bending effects in response to temperature changes, which means that a varying mechanical stress is generated in the package. Therefore, stress decoupling is necessary for pressure sensor devices, which are mounted in a molded package.

A film mold may be used for producing a pressure entry to the active sensor region (diaphragm region in a pressure sensor device), which, however, requires a frame around the sensor core to attain a defined distance from the diaphragm. As an alternative, shaped molding tools may also be used. However, these are expensive and inflexible. One hundred percent sealing may also not be achieved by the molding tool, which means that part of the molded material may enter into the sealed region (pressure entry). Thus, for installation in a molded package, a barrier, a frame around the sensor region, is needed as protection from the molded material. This barrier may be produced in a manner analogous to the inertial sensors, in the form of a cap, which has an opening over the actual sensor region. Inside this barrier, which is referred to below as a cap, e.g., gel may be filled in around the sensor core decoupled from stresses, in order to enable resistance to media. An opening of a diameter of several 100 μm is needed for applying the gel. The size is a function of a plurality of parameters, inter alia, the diameter and the positioning accuracy of the injection nozzle, the size of the diaphragm, and the structure for the decoupling of stress.

In the case of inertial sensors, a wafer substrate, which, from one side, is trenched over a large area for the regions of the bonding pads and the actual sensor region, is normally used as a cap. The through-openings in the cap, that is, holes in the cap wafer substrate, which, in the case of inertial sensors, are normally used only over the bonding pads, are produced, as a rule, with the aid of a standard trenching step. These openings or opening are produced just prior to the bonding of the cap wafer substrate to the sensor wafer substrate.

In the case of use of a cap wafer substrate for a sensor device decoupled from stresses, the cap wafer substrate should initially not have any opening over the sensor region, before it is bonded to the sensor wafer. The sealing resulting from this is necessary for the cooling of the back side by a process gas, for example, helium, during the back-side trenching process for producing a cloud trench (forming a cavity by isotropic etching through anisotropically etched channels). First of all, the cap wafer substrate would become unstable and difficult during the further processing; secondly, for the manual handling, if holes were to be produced there in advance for the bonding pad regions and for the sensor region. In addition, the cap wafer substrate is needed in order for the back-side trenching process to be able to be carried out.

If, using a standard trenching process, a through-opening were to be produced in the cap wafer substrate after the bonding of the cap wafer substrate to the sensor wafer substrate, then, however, during this trenching step, the surface of the sensor wafer substrate would be etched under the opening in an undefined manner. This should be prevented, in order to prevent large deviations in the diaphragm thickness and, thus, the sensitivity. A further option for producing an opening in the cap wafer substrate with the bonding on the sensor wafer substrate is mechanical or mechanical-chemical grinding. In this method, however, mechanical loading on the sensor region decoupled from stress and on the connecting ribs to the surrounding sensor substrate may not be prevented. In the case of this grinding of the cap wafer substrate back to the opening, what is most critical, is that a thin silicon diaphragm remains in the end and may rupture in an unchecked manner in response to further grinding, which means that fragments of this remaining diaphragm may damage the surface of the sensor and the stress-decoupling structures and/or may remain fixed somewhere or remain stuck in the stress-decoupling structures and consequently interfere with the function of the stress-decoupling. In the same way, the particles of grinding may also remain, e.g., adhered or free, in the stress-decoupling structures after the cleaning. Such particles may lead to a reduction in the decoupling of stress, and also to signal noise and to the additional formation of bubbles during the gel-application operation. In this instance, damage to the surface of the sensor region by particles of grinding and etching chemicals may also not be prevented completely.

SUMMARY

The present invention provides a micromechanical sensor device and a corresponding manufacturing method.

Advantageous further refinements of the present invention are described herein.

In accordance with an example embodiment of the present invention, an operational flow is provided, which allows stress-decoupling on the back side of the sensor device to be implemented in combination with an opening on the front side. In particular, in this operational flow, the filling-in with a protective gel, as well as the simultaneous incorporation in a molded package, may be carried out.

The cap substrate forms a frame for a possible film molding operation and/or other molding operation. The front-side opening may be produced without harmful effects being able to act upon the sensor region. In particular, in the manufacturing method of the present invention, the cap substrate does not yet have a through-opening over the sensor region, when it is bonded to the sensor substrate.

The opening-up of the cap substrate to form the front-side opening is carried out without inputting additional stress, without damage and contamination by grinding particles and cap substrate residues, and without damage from etching chemicals over the sensor region. In addition, the sensor substrate having the cap substrate bonded to it is sealed in the direction of the front side by the insulating layer of the SOI wafer, which is first removed after the trench etching process for the decoupling of stress on the lower side of the sensor region. Thus, an additional handling wafer or tapes for sealing may be omitted. This reduces the processing time and the processing costs significantly.

The first silicon layer of the cap substrate provides spacing from the sensor region, which contributes considerably to the decoupling of stress, in particular, during the deposition of additional packaging layers.

According to a preferred further refinement of the present invention, the cavity is connected to the second back side via trenches; a cover film being provided on the second back side. This renders possible an etching process for forming the cavity, while simultaneously maintaining the rigidity.

According to another preferred further refinement of the present invention, the second back side is bonded directly or indirectly to a carrier substrate; and a molded package being provided, which surrounds the micromechanical sensor device in such a manner, that the through-opening is at least partially uncovered. This increases the resistance to media.

According to another preferred further refinement of the present invention, the sensor region includes a pressure sensor region.

According to another preferred further refinement of the present invention, the cap substrate is an SOI substrate including a first silicon layer situated on the first front side, a second silicon layer situated on the first back side, and an insulating layer situated between them; and the through-opening being wider in the first silicon layer than in the second silicon layer. This permits the application of gel, during which it is ensured that the gel also fills the stress relief trench at least partially without the formation of bubbles.

BRIEF DESCRIPTION OF THE DRAWINGS

Additional features and advantages of the present invention are explained below in light of specific example embodiments, with reference to the figures.

DETAILED DESCRIPTION OF EXAMPLE EMBODIMENTS

In the figures, the same reference symbols denote identical or functionally equivalent elements.

Figure 1A:
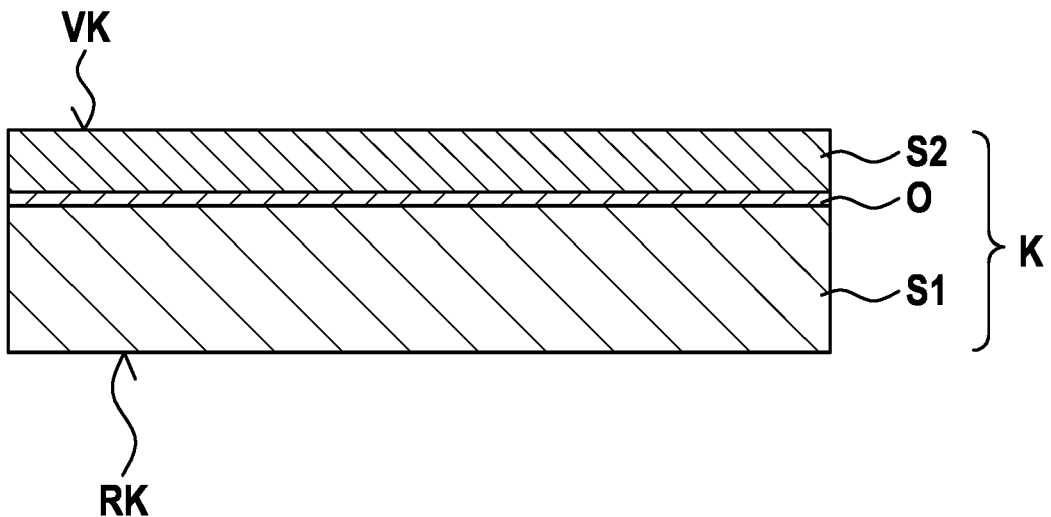
FIGS. 1a)-1l) show schematic cross-sectional views for explaining a micromechanical sensor device and a corresponding manufacturing method according to a specific example embodiment of the present invention.

FIGS. 1a)-1l) are schematic cross-sectional views for explaining a micromechanical sensor device and a corresponding manufacturing method according to a specific example embodiment of the present invention.

In FIG. 1a), reference character K denotes a cap substrate in the form of an SOI substrate, which has a first front side VK and a first back side RK. A first silicon layer S1 is situated on first front side VK, and a second silicon layer S2 is situated on first back side RK; an intermediate insulating layer O, for example, a silicon oxide layer, being situated between first and second silicon layers S1, S2.

Figure 1B:
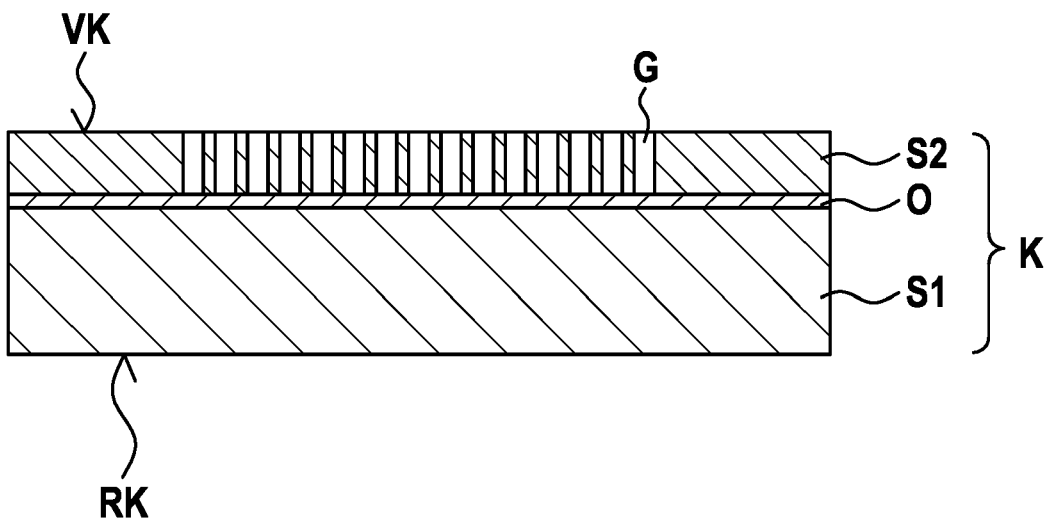

In addition, with reference to FIG. 1b), a trench grid G, which extends through second silicon layer S2 to insulating layer O, is formed by a trench etching process starting from first front side VK. Trench grid G is optimized with regard to rigidity, promotes the rigidity of the remaining insulating layer O during the subsequent method steps, and should have as low a rib width as possible, since it is removed in a later method step.

Figure 1C:
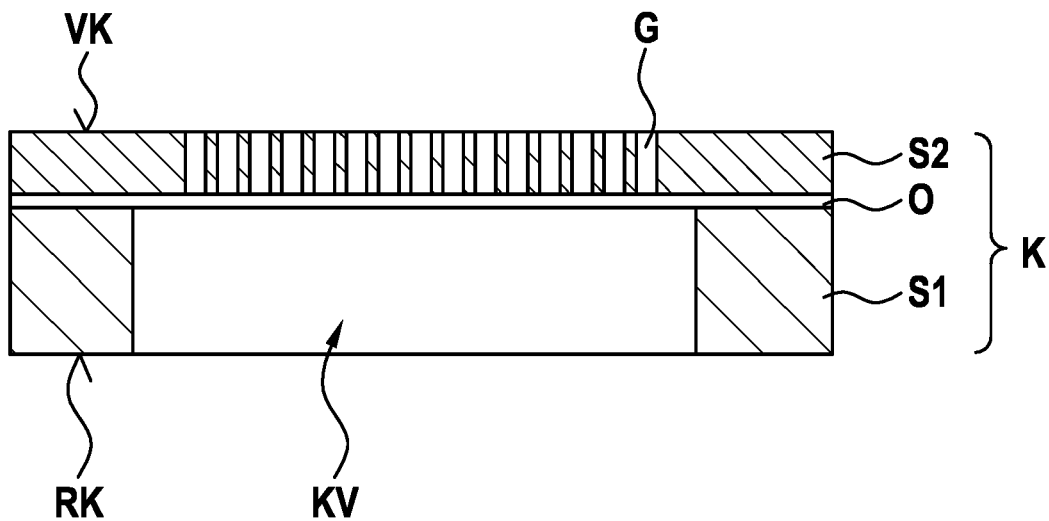

Subsequently, with reference to FIG. 1c), a first through-opening KV, which extends to insulating layer O, is formed in first silicon layer S1, underneath trench grid G, starting from first back side RK.

In the two trench etching steps, insulating layer O is used as an etch stop layer and accordingly remains intact and, thus, impervious to media.

Figure 1D:
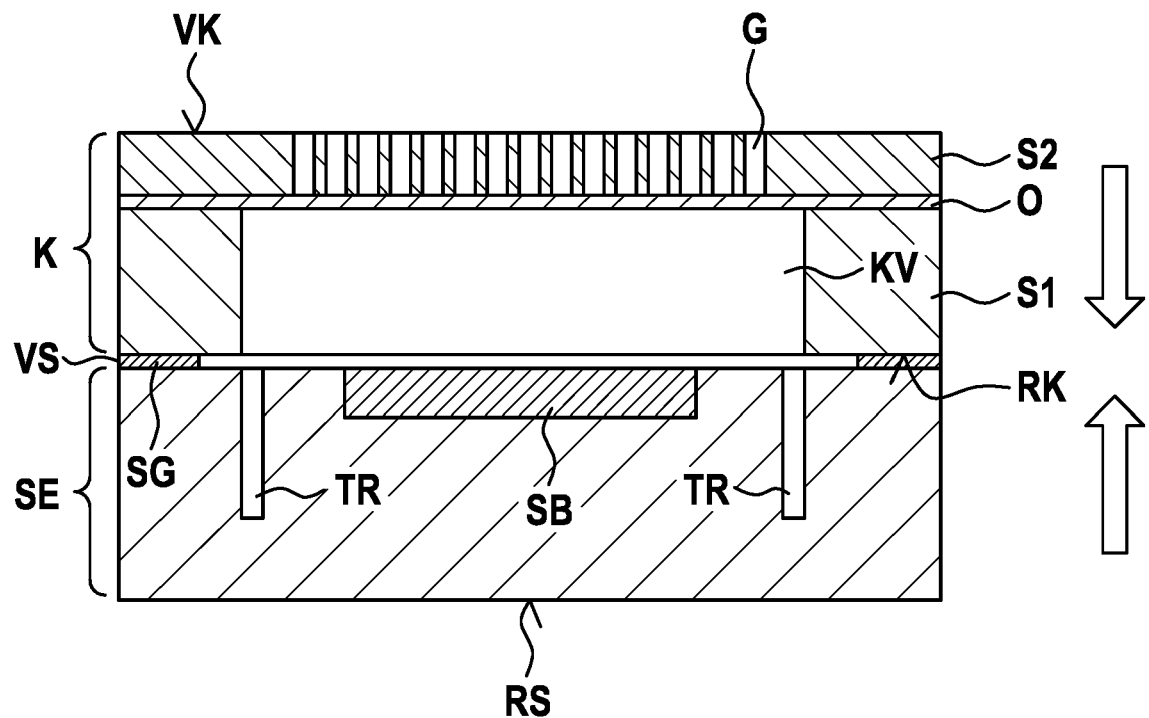

As shown in FIG. 1d), a sensor substrate SE is provided, which has a second front side VS and a second back side RS.

On second front side VS, sensor substrate SE includes a sensor region SB, which is suspended on the remaining sensor substrate SE by a spring device (not shown) and is mechanically decoupled from the rest of sensor substrate SE by a lateral stress-relief trench TR.

Sensor region SB is, for example, a pressure sensor region, which includes a diaphragm (not shown) and piezoresistive resistors that are placed on it and have electrical leads (not shown, as well).

First back side VR of cap substrate K is bonded to second front side VS of sensor substrate SE in such a manner, that first through-opening KV in first silicon substrate S1 is situated above sensor region SB at a distance from it. For example, an annular seal-glass layer SG is used for the bonding.

Other methods are also possible for the bonding, such as a eutectic bonding method or an oxide-to-oxide bonding method, provided that the necessary layers have been suitably introduced into the substrates K, SE involved.

In addition, with reference to FIG. 1e), a cover film TA, e.g., in the form of a tape or a viscous lacquer, is optionally applied to first front side VK as upper-side protection, and makes possible a particularly smooth surface for a later package molding operation, e.g., for more effective sealing.

Furthermore, the rigid composite of cap substrate K and sensor substrate SE may be ground back to the desired target thickness (not shown). This is used, in particular, to satisfy restrictions in the later cloud-trenching operation with regard to the attainable trench depth and, consequently, the maximum residual thickness of sensor substrate SE.

As shown in FIG. 1f), the cloud-trenching operation then takes place, starting from second back side RS. This operation may be carried out, using a two-step etching process; starting from back side RS, trenches TC initially being formed, using suitable masking. In the second step of the etching process, with reference to FIG. 1g), a cavity CK situated in the interior of sensor substrate SE is formed underneath sensor region SB. Cavity CK, which undercuts and, therefore, mechanically decouples sensor region SB, may be formed, for example, by eliminating a passivation and sputtering portion in a DRIE process, which means that undercutting for the production of cavity CK is accomplished by continuing to etch nondirectionally at the base of trenches TC.

In the second substep of the two-step etching process, sensor substrate SE is cooled from second back side RS with the aid of a process gas, for example, helium. The remaining insulating layer O above first through-opening KV provides an etch stop and, at the same time, provides sealing of the substrate composite during the helium cooling.

As a result of the cloud-trenching process, sensor region SB is embedded in an island-like region IB suspended on the remaining sensor substrate SE; island-like region IB being mechanically decoupled from remaining sensor substrate SE by lateral stress relief trenches TR and the cavity CK situated in sensor substrate SE, underneath sensor region SB.

As an alternative to the cloud-trenching process, a large-area trenching process starting from second back side RS is also possible, if a large back-side through-opening of second back side RS can be tolerated for the later process.

Figure 1H:
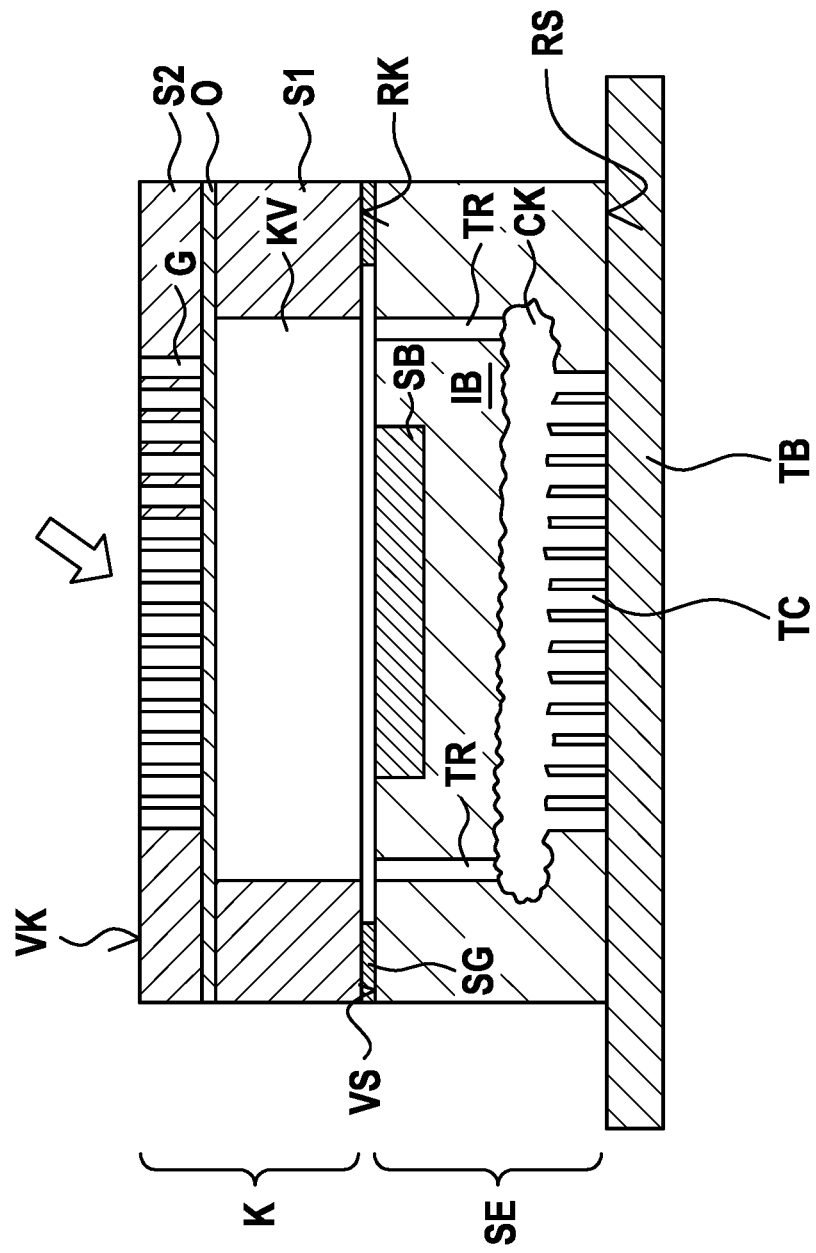

In a subsequent method step, which is shown in FIG. 1h), if present, optional front-side cover film TA is removed, whereupon the processing of first front side VK follows.

Figure 1I:
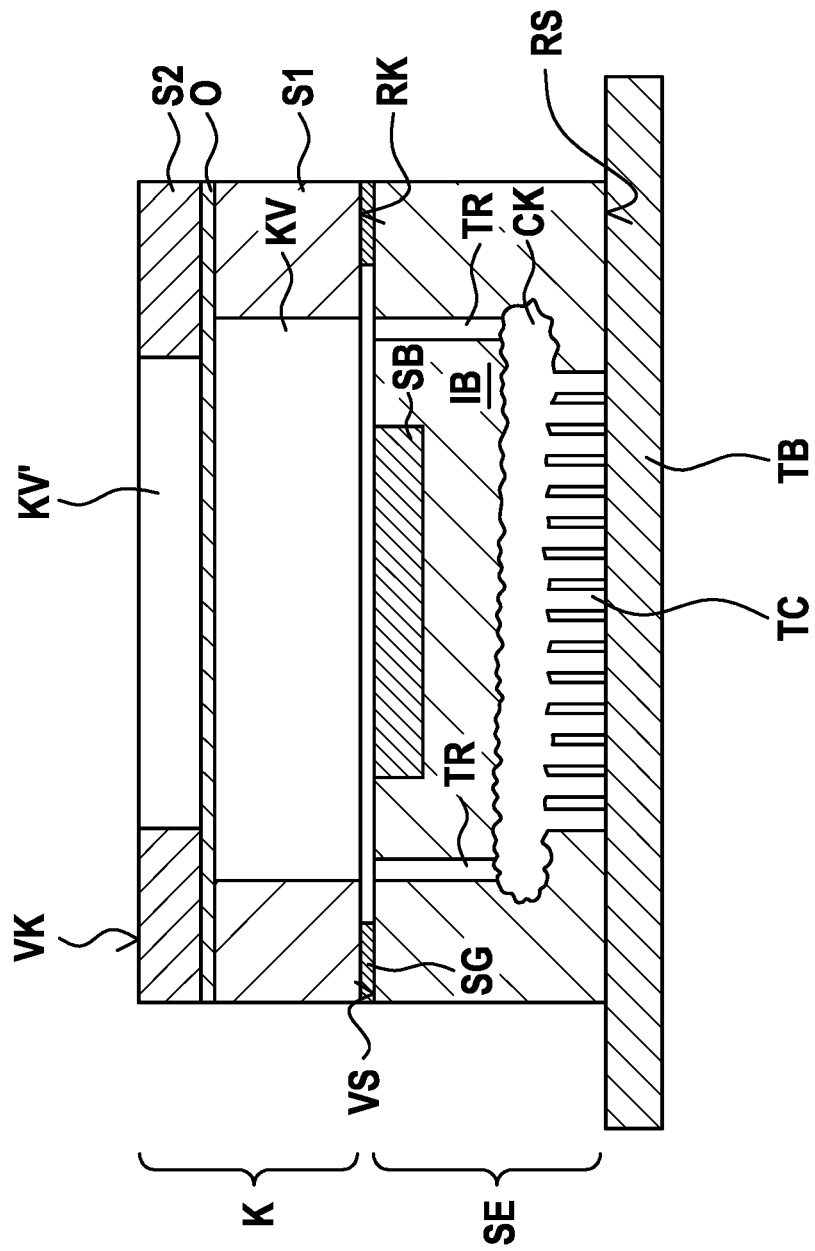

A cover film TB, e.g., in the form of a tape or a viscous lacquer, is optionally applied to second back side RS as upper-side protection, in order to prevent damage from particles, for example, in the event of support by a chuck. During the front-side processing, trench grid G is removed in a brief silicon etching step, which is also possible without a mask; insulating layer O being used again as an etch stop. A second through-opening KV', which extends through second silicon layer S2 to insulating layer O, is formed by removing trench grid G. This results in the process state shown in FIG. 1i).

Figure 1J:
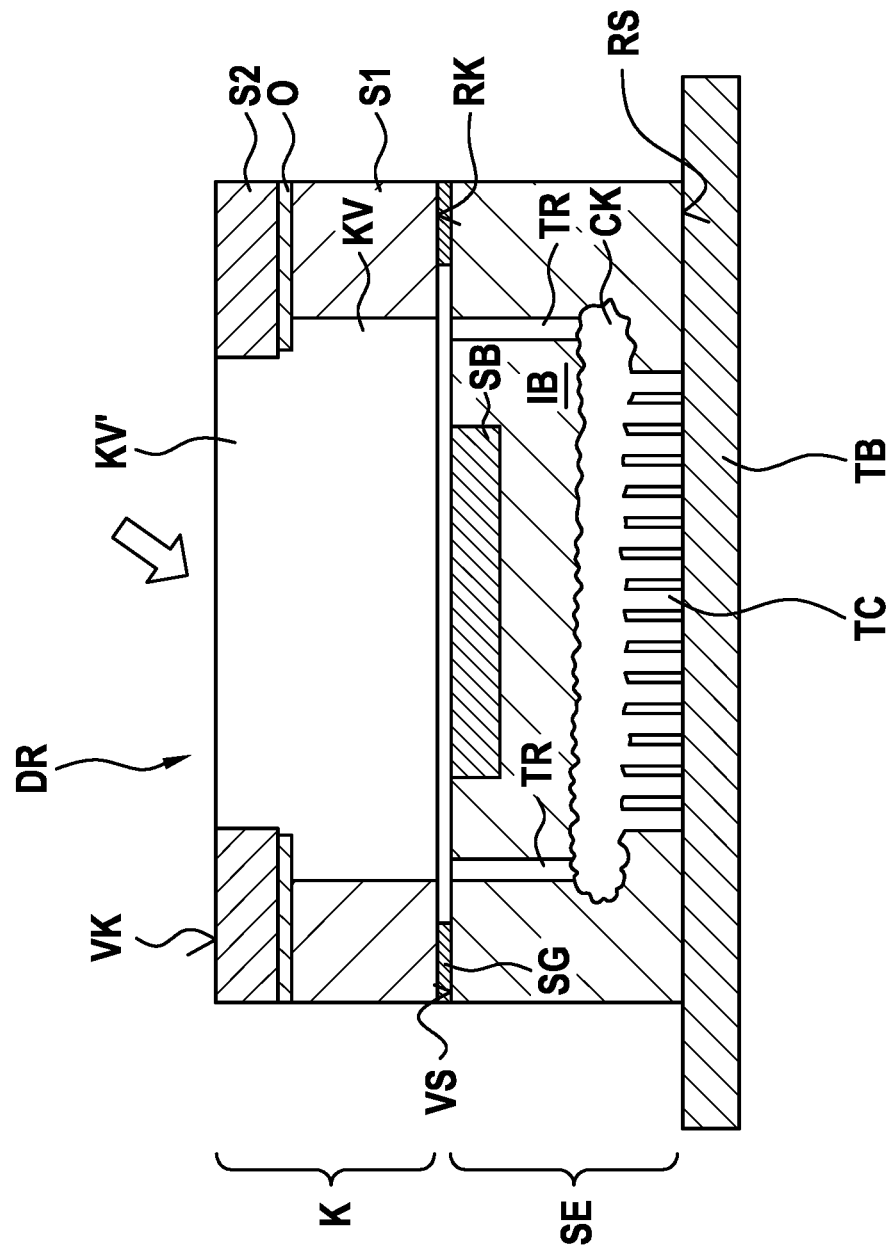

In a further etching step, with regard to FIG. 1j), the remaining diaphragm-like insulating layer O is removed, for example, using HF gas-phase etching. In order to prevent the formation of poisonous ammonium hexafluorosilicate, this may also be accomplished by dry oxide etching (dry RIE), using $C_4F_8$ or the like. The attack on pressure-sensor region SB is tolerable, since only a thin insulating layer O must be removed and, consequently, a small amount of overetching time may be operated with.

Figure 1K:
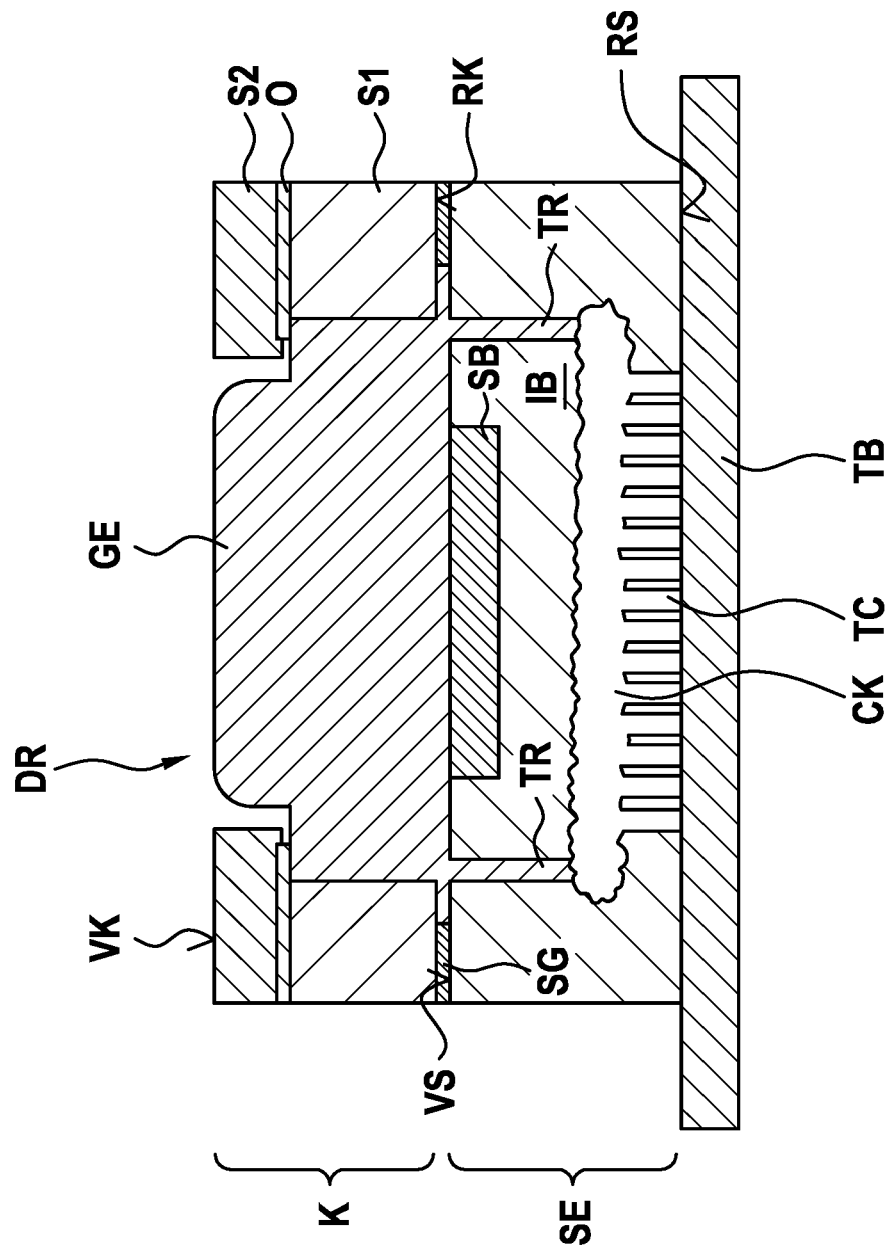

In addition, with reference to FIG. 1k), sensor region SB is then covered with a gel GE, which, starting from first front side VK, fills through-opening DR and stress-relief trench TR at least partially. In the present example, gel GE fills stress-relief trench TR and through-opening DR nearly completely.

Since first through-opening KV in first silicon layer S1 has a larger diameter than the second through-opening in second silicon layer S2, it is easily possible to reach trench TR without forming bubbles and, therefore, to provide damping in trench TR while maintaining the stress-decoupling.

Finally, with reference to FIG. 1l), back-side tape TB may be positioned on a carrier substrate TR, and in a molding method, e.g., using a stamp, the sensor device may be molded around with a molding material MO, so that through-opening DR remains uncovered and forms a media entry to sensor region SB.

Alternatively, cover film TB on second back side RS may be removed, and subsequently, trenches TC may be filled in with a gel, as well.

Figure 2A:
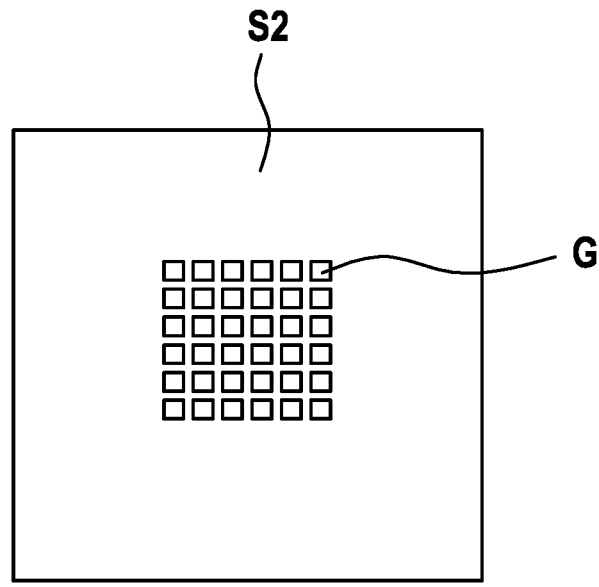
FIGS. 2a)-2d) show different embodiments of the trench grid of the cap substrate of the micromechanical sensor device according to the specific example embodiment of the present invention.
Figure 2B:
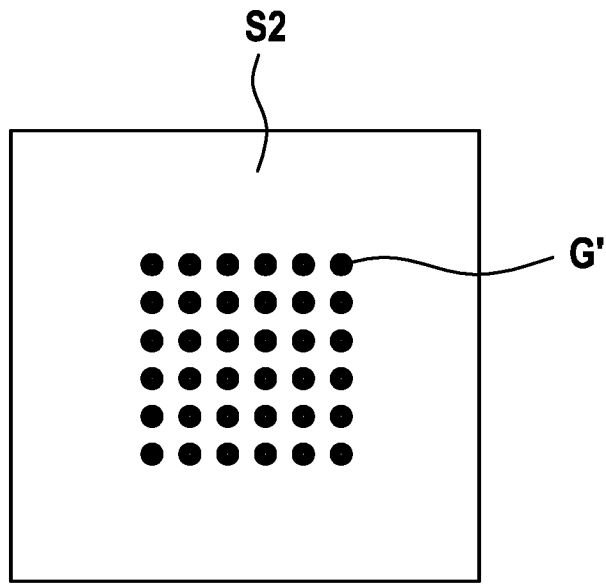
Figure 2C:
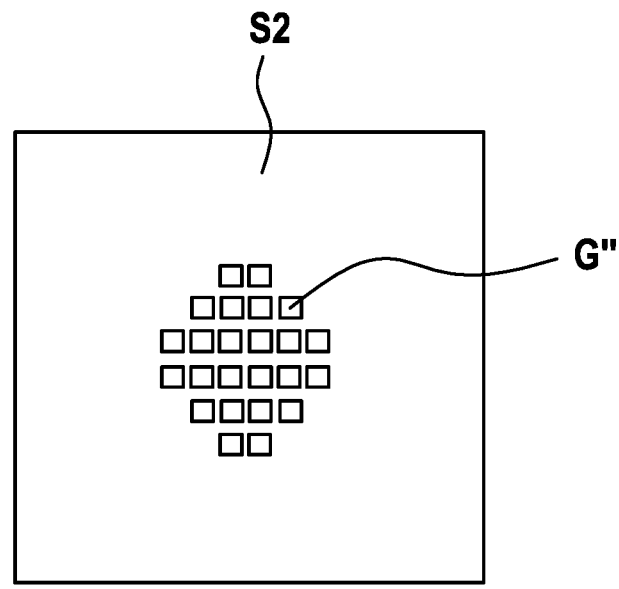
Figure 2D:
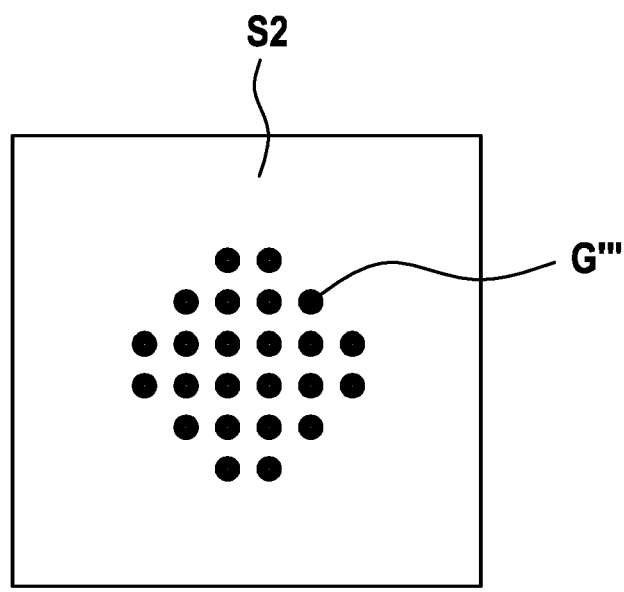

FIGS. 2a)-2d) show different embodiments of the trench grid of the cap substrate of the micromechanical sensor device according to the specific example embodiment of the present invention.

As shown in FIG. 2a) through d), different geometries are possible for trench grid G, G', G'', G''', as long as the rigidity requirements are satisfied.

Figure 3A:
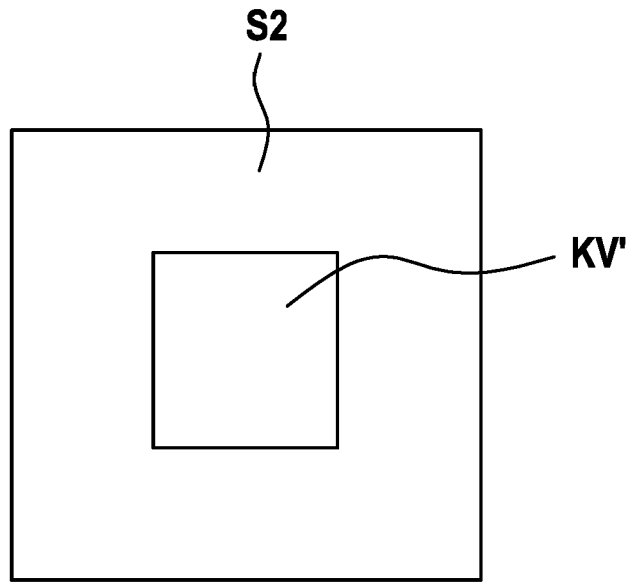
FIG. 3a), 3b) show different embodiments of the second through-opening of the cap substrate of the micromechanical sensor device according to the specific example embodiment of the present invention.
Figure 3B:
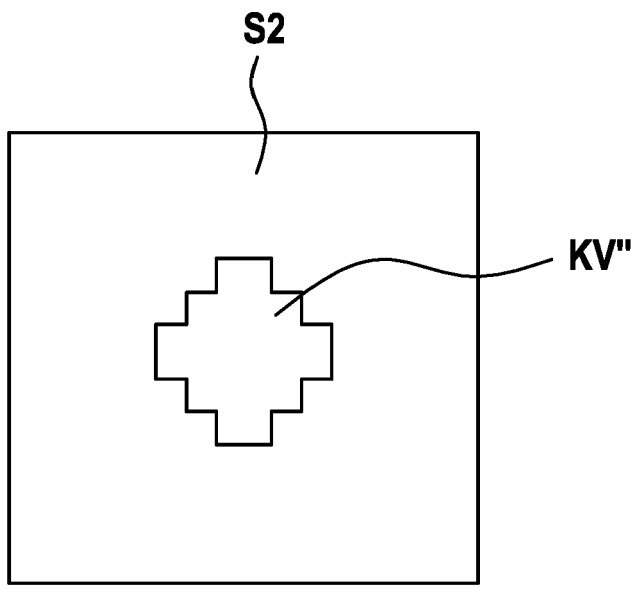

FIGS. 3a), 3b) show different embodiments of the second through-opening of the cap substrate of the micromechanical sensor device according to the specific embodiment of the present invention.

The representations of the second through-opening KV', KV'' in second silicon layer S2 for the configurations according to FIGS. 2a) and b) are shown in FIGS. 3a) and b).

Although the present invention has been described with the aid of preferred exemplary embodiments, it is not limited to these. In particular, the above-mentioned materials and topologies are only illustrative and not limited to the examples explained.

What is claimed is:

1. A micromechanical sensor device, comprising:
a cap substrate which has a first front side facing in a first direction and a first back side facing in a second direction, and which has a through-opening as a media entry region; and
a sensor substrate which has a second front side facing in the first direction and a second back side facing in the second direction, and in which a sensor region is entirely arranged, the sensor region being embedded in an island-like region of the sensor substrate suspended on a remaining region of the sensor substrate, the island-like region being mechanically decoupled from the remaining region of the sensor substrate by a lateral stress-relief trench and a cavity situated in the sensor substrate, underneath the island-like region;

wherein the first back side is bonded to the second front side in such a manner, that the through opening is situated above the sensor region; and wherein the sensor region is covered by a gel, which fills the through-opening and the stress-relief trench at least partially, such that an exterior surface of the sensor region that faces in the first direction is exposed to the gel at the second front side.

2. The micromechanical sensor device as recited in claim 1, wherein the cavity is connected to the second back side via trenches, and a cover film is provided on the second back side.

3. The micromechanical sensor device as recited in claim 1, wherein the second back side is bonded directly or indirectly to a carrier substrate, and a molded package is provided, which surrounds the micromechanical sensor device in such a manner, that the through-opening is at least partially uncovered.

4. The micromechanical sensor device as recited in claim 1, wherein the sensor region includes a pressure-sensor region.

5. The micromechanical sensor device as recited in claim 1, wherein the cap substrate is an SOI substrate including a first silicon layer situated on the first front side, a second silicon layer situated on the first back side, and an insulating layer situated between the first silicon layer and the second silicon layer, and the through-opening extends through at least a part of the first silicon layer and at least a part of the second silicon layer and annularly widens in a radial direction to form a stepped cross-section that is wider in the first silicon layer than in the second silicon layer, the through-opening therefore having a wide section and a narrow section, at least a portion of the exterior surface of the sensor region interfacing with the wide section and facing the narrow section, with the wide section being arranged between the sensor region and the narrow section.

6. A method for manufacturing a micromechanical sensor device, comprising the following steps:

providing a cap substrate in the form of an SOI substrate, which has a first front side facing in a first direction and a first back side facing in a second direction, the cap substrate including a first silicon layer situated on the first front side, a second silicon layer situated on the first back side, and an insulating layer situated between the first silicon layer and the second silicon layer;

forming a trench grid which extends through the second silicon layer to the insulating layer;

forming a first through-opening underneath the trench grid, the first through-opening extending through the first silicon layer to the insulating layer;

providing a sensor substrate which has a second front side facing in the first direction and a second back side facing in the second direction, and in which a sensor region is entirely arranged, the sensor region being suspended on a remainder of the sensor substrate and being mechanically decoupled from the remainder of the sensor substrate by a lateral stress-relief trench;

bonding the first back side to the second front side in such a manner, that the first through-opening is situated above the sensor region;

starting from the second back side, forming a cavity in the sensor substrate in such a manner, that the sensor region is embedded in an island-like region, the island-like region being mechanically decoupled from remainder of the sensor substrate by the lateral stress-relief trench and the cavity situated in the sensor substrate;

forming a second through-opening, which extends through the second silicon layer to the insulating layer, by removing the trench grid;

removing the insulating layer between the first and second through-openings, so that a through-opening is formed as a media entry region; and covering the sensor region with a gel, which, starting from the first front side, fills the through-opening and the stress-relief trench at least partially, such that an exterior surface of the sensor region that faces in the first direction is exposed to the gel at the second front side.

7. The manufacturing method as recited in claim 6, wherein the cavity situated in the sensor substrate is formed, starting from the second back side, in such a manner, that in a two-step etching process, trenches are initially formed on the second back side, and subsequently, the cavity is formed through the trenches.

8. The manufacturing method as recited in claim 7, wherein during the two-step etching process, the second back side is cooled a process gas while the insulating layer is fully intact, the insulating layer thereby functioning, at an opposite side of the sensor substrate than the second back side, as a seal of a composite of the sensor substrate and of the first silicon layer of the cap substrate during the cooling.

9. The manufacturing method as recited in claim 8, wherein the process gas helium.

10. The manufacturing method as recited in claim 6, wherein the first and second through-openings are formed in such a manner, that the through-opening is wider in the first silicon layer than in the second silicon layer.

11. The manufacturing method as recited in claim 6, wherein the second back side is bonded directly or indirectly to a carrier substrate, and a molded package is provided, which surrounds the micromechanical sensor device in such a manner, that the through-opening is at least partially uncovered.

* * * * *